(12) United States Patent
Lipson

(10) Patent No.: US 6,778,581 B1
(45) Date of Patent: Aug. 17, 2004

(54) TUNABLE VERTICAL CAVITY SURFACE EMITTING LASER

(75) Inventor: Jan Lipson, Cupertino, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/253,100

(22) Filed: Sep. 24, 2002

(51) Int. Cl.[7] .............................. H01S 5/00; H01S 3/08; H01S 3/082; H01L 27/15
(52) U.S. Cl. ............................ 372/96; 372/43; 372/92; 372/97; 257/79; 257/80
(58) Field of Search ............................. 372/43, 92, 96, 372/97, 44, 45, 46, 50, 19, 20, 102; 257/79, 80

(56) References Cited

U.S. PATENT DOCUMENTS

| | | | | |
|---|---|---|---|---|
| 5,070,509 A | * | 12/1991 | Meyers ........................ | 372/45 |
| 5,301,201 A | * | 4/1994 | Dutta et al. .................... | 372/43 |
| 5,625,636 A | | 4/1997 | Bryan et al. | |
| 5,684,817 A | | 11/1997 | Houdre et al. | |
| 5,955,749 A | | 9/1999 | Joannopoulos et al. | |
| 6,515,305 B2 | * | 2/2003 | Gopinath ...................... | 257/79 |
| 2002/0163947 A1 | * | 11/2002 | Ostergaard et al. ........... | 372/43 |
| 2002/0167984 A1 | | 11/2002 | Scherer | |
| 2003/0026570 A1 | * | 2/2003 | Malsuura et al. ........... | 385/129 |

OTHER PUBLICATIONS

O. Painter et al., *Two–Dimensional Photonic Band–Gap Defect Mode Laser*, vol. 284, Science, Jun. 11, 1999, pp. 1819–1920.

Dae–Sung Song et al., *Single–Fundamental–Mode Photonic–Crystal Vertical–Cavity Surface–emitting Lasers*, Applied Physics Letters, vol. 80, No. 21, May 27, 2002, pp. 3901–3903.

Kent D. Choquette et al., *Vertical Cavity Photonic Integrated Circuits*, Department of Electrical and Computer Engineering University of Illinois, pp. 508–510.

Dae–Sung Song, et al., *Single–Fundamental–Mode Photonic–crystal Vertical–cavity surface–emitting Lasers*, Applied Physics Letters, vol. 80, No. 21, May 27, 2002, pp. 3901–3903.

* cited by examiner

Primary Examiner—Paul Ip
Assistant Examiner—Armando Rodriguez
(74) Attorney, Agent, or Firm—Workman Nydegger

(57) ABSTRACT

A tunable vertical cavity surface emitting laser (VCSEL) using photonic crystals and an electrostrictive material that includes a hologram with a narrow filter function. Photonic crystals are formed such that the active region of the VCSEL is bounded by the photonic crystals. The photonic crystals have a periodic cavity structure that reflects light of certain wavelengths through the active region of the VCSEL such that laser light at the wavelengths is generated. The periodic cavity structure includes a central defect that does not include any cavities. The single mode is emitted through the central defect. The electrostrictive material that includes a hologram makes the VCSEL tunable because the shape of the electrostrictive material changes when an electric field is applied. The filter function of the hologram thus changes as well in response to the electric field such that the VCSEL is tunable.

22 Claims, 4 Drawing Sheets

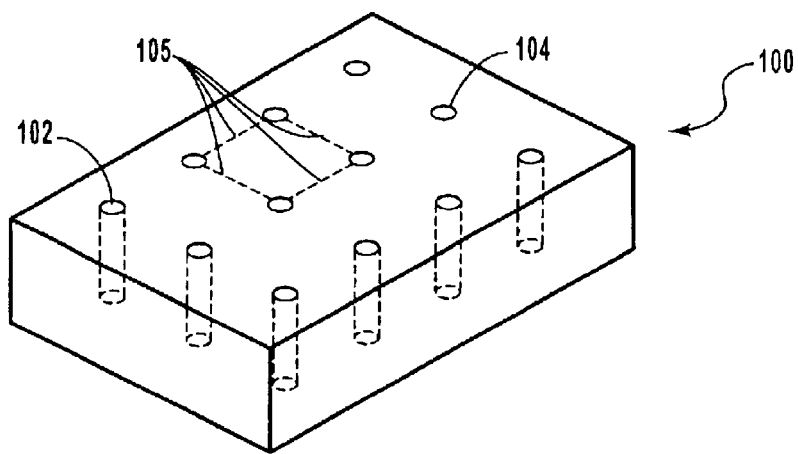
Fig. 1
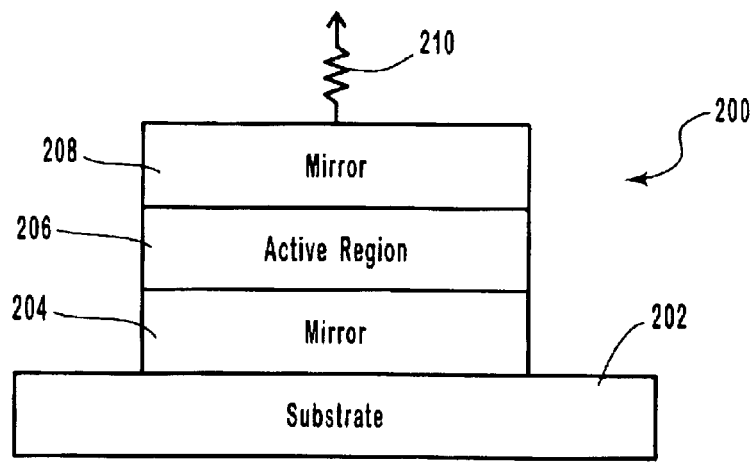
Fig. 2A
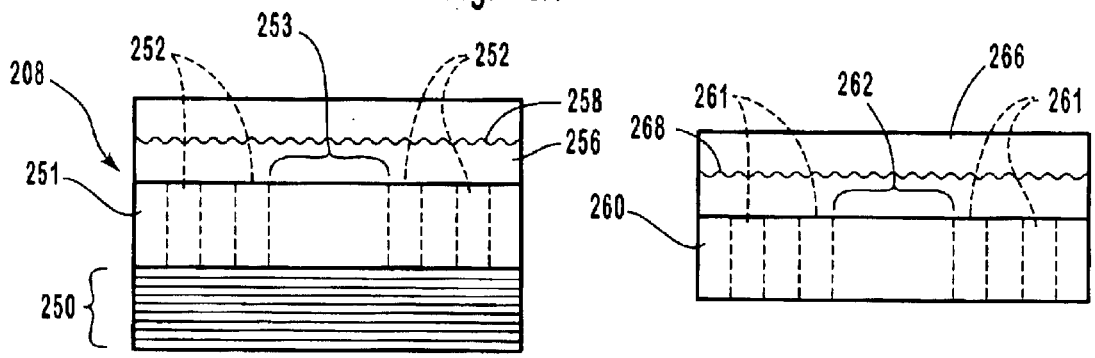
Fig. 2B
Fig. 2C

TUNABLE VERTICAL CAVITY SURFACE EMITTING LASER

BACKGROUND OF THE INVENTION

1. The Field of the Invention

The present invention relates to tunable vertical cavity surface emitting lasers. More particularly, the present invention relates to tunable vertical cavity surface emitting laser using an electrostrictive polymer that includes a holographic optical element with a narrow filter function.

2. Background and Relevant Art

Vertical cavity surface emitting lasers (VCSELs) are an example of semiconductor lasers that are used in optical fiber systems. VCSELs have several advantages over other types of semiconductor lasers. VCSELs can be manufactured in large quantities due to their relatively small size and can often be tested on a single wafer. VCSELs typically have low threshold currents and can be modulated at high speeds. VCSELs also couple well with optical fibers.

VCSELs typically emit wavelengths on the order of 0.85 microns. VCSELs that operate at single wavelengths or at longer wavelengths on the order of 1.3 to 1.55 microns, which are more useful in optical communications systems, are very difficult to manufacture or fabricate. The difficulty in fabricating VCSELs that generate light in a single mode and/or at longer wavelengths is often related, for example, to the atomic lattice structure of the materials, the quality of the active region or gain medium, the reflectivity of the mirror systems, and the material composition.

Another problem with VCSELs is related to their tunability. Tunable semiconductor lasers are very useful, especially in wavelength-division multiplexing (WDM) systems. When fixed wavelength lasers are used in WDM systems, it is necessary to have a separate VCSEL for each wavelength. For example, a 100 channel WDM system requires 100 different VCSELs. This leads to a number of different problems from maintaining an adequate inventory for spare parts to producing and testing VCSELs of varying wavelengths. A tunable laser can alleviate many of these expensive issues.

In general, tunable lasers often suffer from needing a long gain cavity in order to generate sufficient gain. From a tuning perspective, the long cavity is extraneous and complicates the tuning functionality because the modes of the gain cavity, for example, must be kept in a fixed relationship with respect to the tuning clement. Thus, many tunable lasers require a phase adjust section. VCSELs have the desired short cavities, but the gain for single mode VCSELs is insufficient to allow generation of optical power in the multi-milliWatt range. Increasing the diameter of the VCSEL aperture to increase power also results in multi mode emission.

BRIEF SUMMARY OF THE INVENTION

These and other limitations are addressed by the present invention, which relates to a tunable vertical cavity surface emitting laser that emits a single mode. The single mode is emitted by forming a photonic crystal in the VCSEL that is highly reflective for certain wavelengths. As a result, only the reflected mode(s) achieves appreciable gain in the active region of the VCSEL. The photonic crystal also includes a central defect for propagation of the emitted light. The tunablity is achieved by forming an electrostrictive material on the VCSEL. A reflection hologram or holographic optical element (HOE) with a narrow filter function is included in the electrostrictive material. The central wavelength of the HOE can be tuned by applying an electric field or voltage to the electrostrictive material. Advantageously, the tunable VCSEL can emit a single mode over a tunable range and higher power at longer wavelengths.

In one embodiment of the present invention, a photonic crystal with a central defect is formed on the upper DBR layers of a VCSEL, or a periodic cavity structure is formed directly in the DBR layers. Alternatively, the DBR layers are omitted and the photonic crystal with the central defect is formed directly on the active region. The reflectivity of the photonic crystal is dependent on the wavelength of the light and on the angle of incidence. The photonic crystal provides the necessary reflectivity such that a single mode is reflected through the active region, which results in stimulated emission of photons at the corresponding wavelength of the incident photon. Usually, the central defect corresponds to an aperture through which the laser light is emitted from the VCSEL.

After the photonic crystal is formed, a tuning element is also formed on the photonic crystal. The tuning element is an electrostrictive polymer that includes a reflection hologram or HOE with a narrow filter function. The electrostrictive polymer undergoes dimensional changes when an electric field is applied and the center wavelength of the HOE is thereby tunable. The HOE also has high reflectivity and the DBR layers may be omitted in one embodiment.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which:

FIG. 1 is a perspective view of a photonic crystal or layer with a periodic cavity structure;

FIG. 2A illustrates a vertical cavity surface emitting laser with an electostrictive filter where the mirror layers are formed from photonic crystals and/or DBR layers;

FIG. 2B illustrates an electrostrictive filter that is formed on a mirror layer that includes a photonic crystal and Distributed Bragg Reflector layers;

FIG. 2C illustrates an electrostrictive filter that is formed on a mirror layer that only includes a photonic crystal;

DETAILED DESCRIPTION OF THE PREFERRED EMBODIMENTS

Figure 2D:
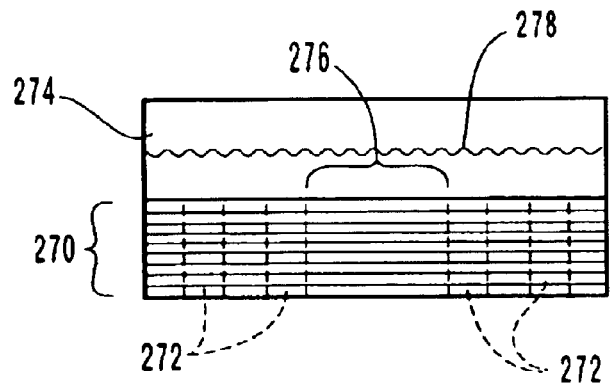
FIG. 2D illustrates an electrostrictive filter that is formed on a mirror layer where the periodic cavities have been formed directly in the upper DBR layers.

Vertical cavity surface emitting lasers (VCSELs) are some of the most common light sources used in fiber optics. At a basic level, VCSELs are essentially pn-junctions that convert electrical energy into light energy. Typically, a gain medium or active region is formed at the pn-junction between the p-type semiconductor material and the n-type semiconductor material. The active region often includes quantum wells that can be either compressively or tensile strained quantum wells. The active region may also include quantum dots.

In VCSELs, mirrors or mirror layers are formed both above and below the active region. The mirrors reflect light or photons back and forth the through the active region of the VCSEL. Within the VCSEL cavity that is effectively bounded by the mirrors or by this mirror system, the light resonates vertically or perpendicularly to the pn-junction. Because the light is resonating vertically, the cavity length of a VCSEL is often very short with respect to the direction of light travel. The length of the cavity thus has an effect on the ability of a photon to stimulate the emission of additional photons, particularly at low carrier densities. Some of the light escapes the mirror system and emerges from a surface of the VCSEL The mirrors or the mirror system of a VCSEL must be highly reflective and this high reflectivity requirement cannot be achieved through the use of metallic mirrors. VCSELs currently employ Distributed Bragg Reflector (DBR) layers. DBR layers are formed by forming or growing alternating layers of semiconductor or dielectric materials whose refractive index varies. Light is reflected at the junctions of these alternating layers and in order to achieve the high reflectivity required by VCSELs, many layers must be formed or grown as previously discussed.

The present invention relates to vertical cavity surface emitting lasers that can be tuned to emit single modes at various wavelengths including longer wavelengths that are more suitable for optical communication systems. VCSELs structured as described herein also have the advantage of being able to generate increased power in a single mode. These and other advantages are achieved by forming the mirror system or mirror layers of VCSEL using photonic crystals or using a combination of DBR layers and photonic crystals. In one embodiment, the photonic crystal includes a central defect. In another embodiment, an electrostrictive material that includes a holographic optical element or reflection hologram in included in the VCSEL.

A photonic crystal is a material that has a cavity or hole structure formed therein that is reflective for certain wavelengths while other wavelengths are not reflected. In other words, the reflectivity of photonic crystals is wavelength dependent and the particular wavelength(s) reflected by a photonic crystal is often related to the cavity or hole structure of the photonic crystal. FIG. 1 illustrates an exemplary photonic crystal or layer. A material becomes a photonic crystal when a plurality of cavities or holes that are periodic in nature are formed or structured therein, as illustrated by the photonic crystal 100. Thus, any material, including DBR layers, are referred to herein as photonic crystals when a periodic cavity or hole structure is formed therein.

Cavities 102 and 104 are examples of the cavities that are formed in the photonic crystal 100. Each cavity typically passes through the photonic crystal 100. It is also possible for the cavity structure to be formed such that the photonic crystal 100 is not perforated by cavities. In another example, the cavities pass completely through the photonic crystal and extend into other layers of the VCSEL. The cavities are formed or drilled in the photonic crystal 100 using, for example, electron lithography. The distance between cavities in the cavity structure affects the wavelength of laser light that is emitted by the VCSEL. In one example, the photonic crystal 100 enables VCSELs to generate wavelengths on the order of 1.3 to 1.55 microns in a single mode at higher power. Power can be increased by enlarging the aperture that is formed, in one example, by oxidizing some of the DBR layers.

The wavelength(s) emitted by a VCSEL can be altered by changing characteristics or attributes of the photonic crystal. Characteristics or attributes that can be changed such that a VCSEL emits a different wavelength(s) include, but are not limited to, the periodic cavity structure (rhombic cavity structure, square cavity structure, triangular cavity structure, hexagonal cavity structure, and the like), the shape of the cavities (circular, square, triangular, and the like), the angle of the cavities with respect to the surface of the photonic crystal, the depth of the cavities, the material from which the photonic crystal is formed, the thickness of the photonic crystal, the size and shape of a central defect in the photonic crystal, and the like or any combination thereof. The reflectivity of the photonic crystal is also dependent on wavelength and incident angle. Thus, a VCSEL with a photonic crystal emits a single mode and the wavelength of the emitted mode is related to the photonic crystal.

FIG. 2A is a block diagram that illustrates generally the structure of a VCSEL in accordance with the present invention. The VCSEL 200 begins with a substrate 202. A lower mirror layer 204 is formed or grown on the substrate 202. An active region 206 is next formed or grown on the mirror layer 204. On the active region 206, an upper mirror layer 208 is grown or formed. As the mirror layers 204 and 208 repeatedly reflect light or photons through the active region 206, the laser light 210 is ultimately generated and exits the VCSEL 200 as laser light 210. An electrostrictive filter is often included as an additional layer in the upper mirror layer 208 or as a separate layer. The electrostrictive filter includes a HOE or a reflection hologram with a narrow filter function. The VCSEL 200 is tunable because the central wavelength of the HOE or the reflection hologram changes as an electric field is applied to the electrostrictive filter.

The active region 206 is typically formed from a semiconductor material. The mirror layers 204 and 208 can be formed from or include photonic crystals or layers. The photonic crystals provide the reflectivity required by the VCSEL 200 and are not as difficult to grow as the multiple DBR layers previously discussed. Employing photonic crystals in the mirror layers of a VCSEL makes VCSELs easier to fabricate and reduces cost. In addition, VCSELs that emit different wavelengths of light can be fabricated on the same wafer by controlling the cavity structures or other attributes of the photonic crystals.

The photonic crystals can be formed, for example, from GaAs, AlGaAs, InGaAs, InP, GaInAsP, AlGaInAs, InGaAsN, InGaAsSb, and the like. The photonic crystals can also be formed from dielectric materials that can be deposited in a thin film. The material used to fill the cavities also extends to similar materials, although the cavities are often filled with air. The resonance frequency of the photonic crystal can be altered or changed if the refractive index of the material used to form the photonic crystal and/or fill the cavities is tunable.

FIG. 2B illustrates an exemplary mirror layer 208. In FIG. 2B, the mirror layer 208 includes the DBR layers 250, the photonic crystal 251 and an electrostrictive filter 256. The mirror layer 208 is formed on the active region of the VCSEL. In this example of the mirror layer 208, the number of DBR layers required to attain sufficient reflectivity is reduced because of the reflectivity of the photonic crystal 251. A reflection hologram or HOE 258 embedded in the electrostrictive filter 256 also contributes to the reflectivity of the mirror layer 208.

FIG. 2C illustrates another example of the mirror layer 208, where the DBR layers are absent and only the photonic crystal 260 and the electrostrictive filter 266 are present. As previously stated, the photonic crystal 260 provides the reflectivity required by a VCSEL, although the HOE 268 embedded in the electrostrictive filter 266 may also contribute to the reflectivity. Both FIG. 2B and FIG. 2C illustrate cavities 252 and 261 that have been formed in the photonic crystals 251 and 260, respectively. The cavities 252 and 261 are formed before the electrostrictive filters 256 and 266 are formed.

Figure 2E:
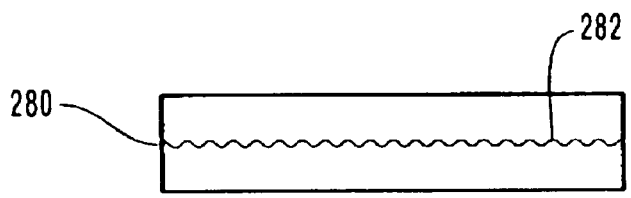
FIG. 2E illustrates a mirror layer that only includes an electrostrictive filter with an embedded holographic optical element.
Figure 2F:
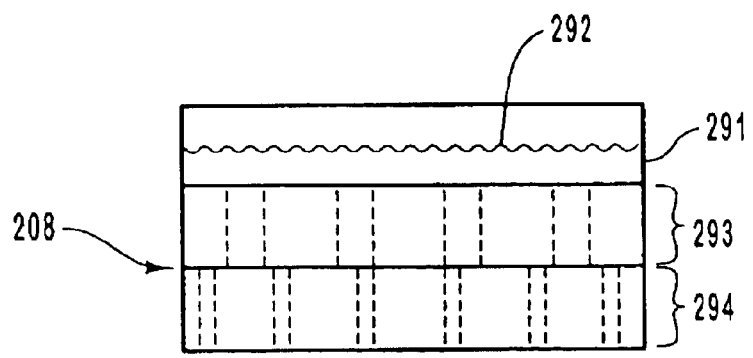
FIG. 2F illustrates a mirror layer that includes a first photonic crystal, a second photonic crystal and an electrostrictive filter with an embedded holographic optical element.

FIG. 2D illustrates another example of the mirror layer 208. In this example, the cavities 272 are formed directly in the DBR layers 270. The electrostrictive filter 274 with an included HOE 276 is then formed on the DBR layers 270. In FIG. 2E, the mirror layer 208 only includes the electrostrictive filter 280 that includes a HOE 282. The reflection hologram 282 provides the requisite reflectivity of the VCSEL. The mirror layer 208 illustrated in FIGS. 2B, 2C, 2D, and 2E can also be used as the mirror layer 204 of the VCSEL 200 shown in FIG. 2A. FIG. 2F illustrates another example of the mirror layer 208. In this example, the mirror layer 208 includes an electrostrictive filter 291, a photonic crystal 293 and an additional photonic crystal 294.

In each example where a photonic crystal includes a periodic cavity structure, a central defect has also been formed. In each case, the central defect does not include any cavities, but is surrounded by the periodic cavity structure. FIG. 2B illustrates a central defect 253, FIG. 2C illustrates a central defect 262, and FIG. 2D illustrates a central defect 276.

Figure 3:
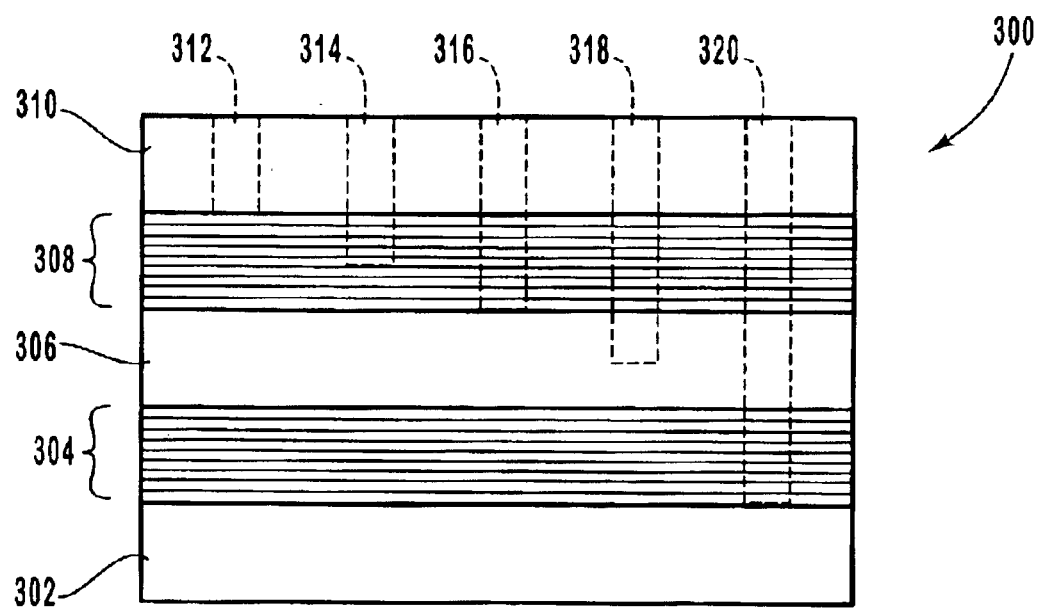
FIG. 3 illustrates that the cavities or holes formed in the photonic crystal can have different depths and that the cavities can extend into other layers of the vertical cavity surface emitting laser.

FIG. 3 illustrates another example of a VCSEL 300 that incorporates photonic crystals in a mirror layer of a VCSEL. In this example, the lower mirror of the VCSEL 300 is formed from DBR layers 304. The upper mirror layer of the VCSEL 300 is a combination of the DBR layers 308 and a photonic crystal 310. As previously stated, when photonic crystals are included as part of the mirror layers, the number of DBR layers 308 can be reduced or omitted completely.

FIG. 3 also illustrates that the cavities formed in the photonic crystals can have depths that extend into other layers of the VCSEL 300. For example, the cavity 312 is limited to the photonic crystal 310, the cavity 314 extends into the DBR layers 308, the cavity 316 extends completely through the DBR layers 308, the cavity 318 extends into the active region 306, and the cavity 320 extends into the lower DBR layers 304. The depth of the cavities that are formed in the VCSEL 300 can vary and typically have an impact on the mode that is emitted by the VCSEL 300. In one embodiment of a VCSEL, all cavities are typically formed to substantially the same depth. For example, all of the cavities may extend into the active region. In another embodiment, the depth of the cavities can vary. After the cavities are formed in the VCSEL 300, the electrostrictive filter is formed.

Figure 4:
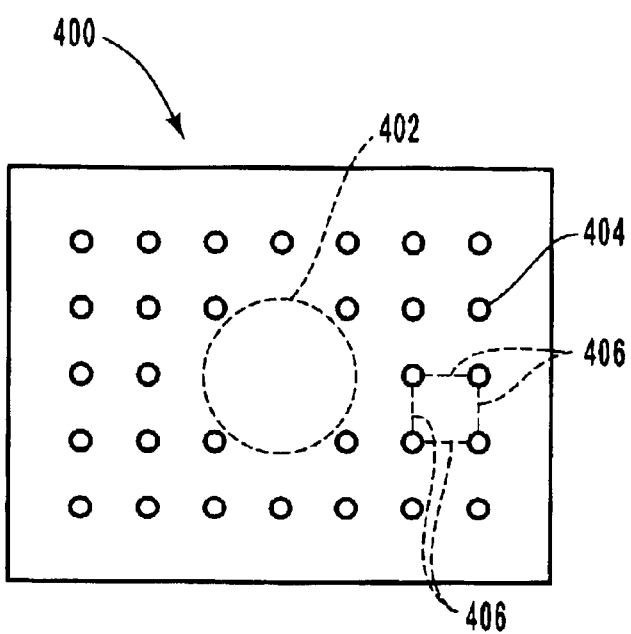
FIG. 4 illustrates a top view of a vertical cavity surface emitting laser that includes a photonic crystal with a lattice or cavity structure that defines a central defect that does not include any cavities.

FIG. 4 is a top view of a VCSEL whose structure includes a photonic crystal with a central defect. Typically, the cavities of the photonic crystal are formed in the VCSEL after the photonic crystal has been formed as a thin film on the active region or DBR layers. The cavities or holes are then drilled using, for example, electron lithography or other lithography technique. FIG. 4 illustrates that the cavities formed in the VCSEL 400 have been formed, in this particular example, using a square cavity structure 406. The cavities can be formed using other cavity structures as well.

A central defect 402 is formed by not drilling or forming cavities or holes in a portion of the photonic crystal. The lattice structure of the cavities or holes surround, in this example, the central defect 402. In other words, the central defect 402 does not include any cavities or holes. In one embodiment, the central defect 402 permits the single mode to propagate through the photonic crystal. Because of the wavelength dependence of the reflectivity of the photonic crystal, the VCSEL lases at a single mode. In addition, the emitted mode may have a wavelength on the order of 1.3 or 1.55 micrometers, although the present invention is not limited to these wavelengths. By increasing the size of the aperture and/or the central defect 402, the power of the VCSEL 400 can be increased without emitting additional modes.

Figure 5:
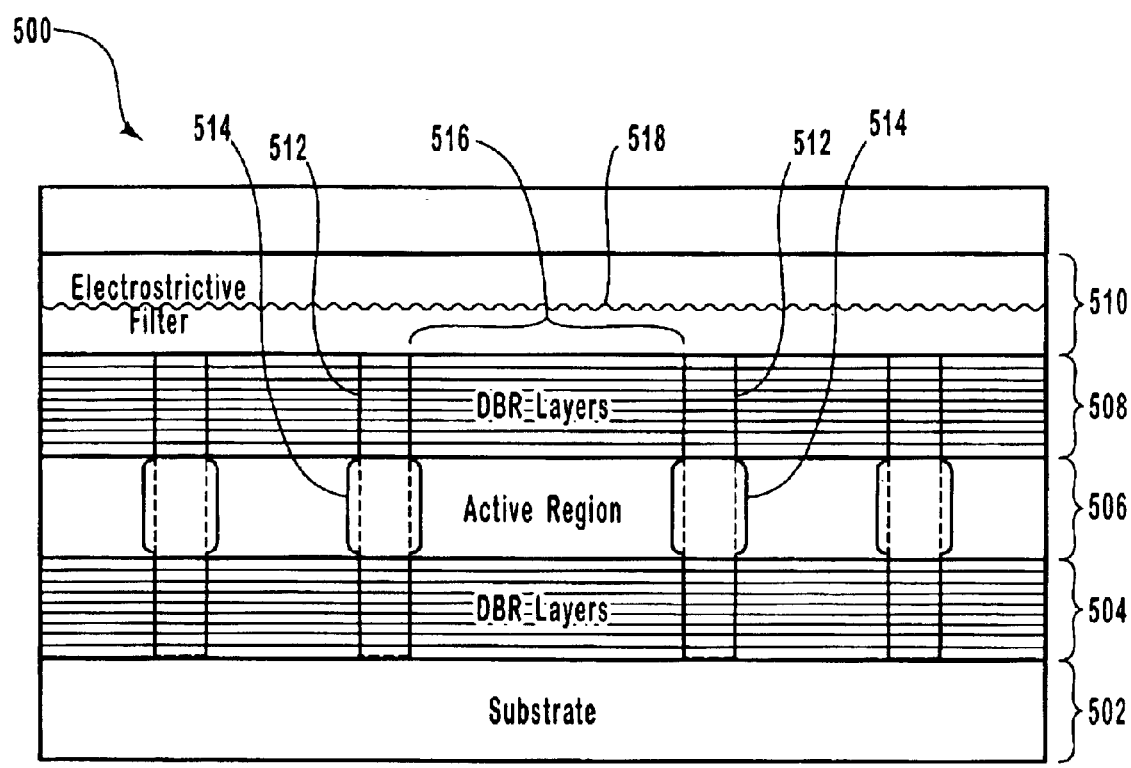
FIG. 5 illustrates a vertical cavity surface emitting laser where the cavities formed in the photonic crystal extend into the active region and are surrounded by a semi-insulating material in the active region.

FIG. 5 illustrates a cross section of a tunable VCSEL 500. In this example, the mirror layer only includes the DBR layers 508. The cavities have been formed directly in the DBR layers 508. Thus, the DBR layers 508 can be referred to as a photonic crystal. The photonic DBR layers include a central defect 516 that is surrounded by cavities that extend through both the DBR layers 508 and the active region 506, and into the lower DBR layers 504. To prevent surface recombination of carriers where the cavities 512 traverse the active region 506, semi-insulating regions 514 have been grown in the active region. In one example, the composition of the semi-insulating regions 514 is FeInP. An electrostrictive filter 510 has been formed on the photonic DBR layers 508. The electrostrictive filter 510 includes a reflection hologram or HOE 518. Finally, a contact 520 is formed on the electrostrictive filter 510.

After the active region has been formed on the lower DBR layers 504, the semi-insulating regions 514 are formed in the active region. The semi-insulating regions 514 are formed where the cavities 512 will be formed. Next the photonic crystal 506 is formed on the active region that includes the semi-insulating regions 514 and 516. Finally, the cavities 512 are drilled in the DBR layers 508, through the semi-insulating regions 514 in the active region 506 and into the lower DBR layers 504. Thus, the cavities 512 are drilled such that the cavities penetrate the previously formed semi-insulating regions 514 and 516. In this manner, the effects of surface recombination of carriers is reduced or eliminated.

As previously stated, the electrostrictive filter 510 includes a reflection hologram or HOE 518 with a narrow filter function. The HOE 518 is a diffractive element that includes a fringe system. The fringes of the HOE 518 are parallel to the surface of the VCSEL. The center wavelength of the HOE can be tuned by applying an electric field to the electrostrictive filter 510. As the electrostrictive filter 510 changes shape in response to the electric field, the narrow filter provided by the HOE shifts. This provides a free spectral range that the VCSEL can tune. In one embodiment, the free spectral range is on the order of 40 nanometers, which is sufficient to not require phase adjustment.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A tunable vertical cavity surface emitting laser comprising:
   a lower mirror layer formed on a substrate, wherein the lower mirror layer includes a plurality of distributed Bragg reflector layers;
   an active region formed on the lower mirror layer, wherein the active region includes a plurality of quantum wells;
   a plurality of semi-insulating regions formed in the active region;
   an upper mirror layer formed on the active region, wherein the upper mirror layer includes an upper photonic crystal with a central defect, wherein the central defect is surrounded by a plurality of cavities that are drilled in the upper photonic crystal and through the semi-insulating regions such that the plurality of semi-insulating regions become a plurality of semi-insulating rings, wherein the central defect comprises a region without cavities or holes;
   a tunable element formed on top of the upper photonic crystal of the upper mirror layer, wherein a wavelength of an emitted mode is changed by applying an electric field to the tunable element.

2. A tunable vertical cavity surface emitting laser as defined in claim 1, wherein the upper mirror layer further comprises a plurality of distributed Bragg reflector layers separate from the photonic crystal.

3. A tunable vertical cavity surface emitting laser as defined in claim 1, wherein the plurality of cavities has a periodic structure except for the central defect, which does not contain any cavities.

4. A tunable vertical cavity surface emitting laser as defined in claim 1, wherein the lower mirror layer further comprises a lower photonic crystal that has a periodic cavity structure without a central defect.

5. A tunable vertical cavity surface emitting laser as defined in claim 1, wherein the upper mirror layer further comprises an additional photonic crystal, separate from the upper photonic crystal, that has a periodic cavity structure.

6. A tunable vertical cavity surface emitting laser as defined in claim 1, wherein the tunable element further comprises an electrostrictive material.

7. A tunable vertical cavity surface emitting laser as defined in claim 6, wherein the tunable element further comprises a reflection hologram with a narrow filter function.

8. A tunable vertical cavity surface emitting laser that emits a single mode, the vertical cavity surface emitting laser comprising:
   a substrate;
   a lower mirror layer formed on the substrate, wherein the lower mirror layer includes a plurality of distributed Bragg reflector layers;
   an active region formed on the lower mirror layer, wherein the active region includes a plurality of quantum wells;
   an upper mirror layer that includes an upper photonic crystal that has a periodic cavity structure with a central defect formed therein, wherein each cavity has a depth that extends at least through the upper mirror layer such that the single mode is reflected by the upper photonic crystal and has appreciable gain in the active region and wherein the central defect does not have any cavities formed therein; and
   an electrostrictive filter formed on the upper mirror layer, wherein the electrostrictive filter includes a hologram that alters a wavelength of the emitted single mode in response to changes in an electric field applied to the electrostrictive material.

9. A tunable vertical cavity surface emitting laser as defined in claim 8, wherein the lower mirror layer further comprises a lower photonic crystal that includes a periodic cavity structure without a central defect.

10. A tunable vertical cavity surface emitting laser as defined in claim 8, wherein the cavities of the periodic cavity structure of the upper photonic crystal are filled with air.

11. A tunable vertical cavity surface emitting laser as defined in claim 8, wherein the upper mirror layer further comprises an additional photonic crystal, separate from the upper photonic crystal, that has a periodic cavity structure.

12. A tunable vertical cavity surface emitting laser as defined in claim 8, wherein semi-insulating regions having a periodic structure are formed in the active region.

13. A tunable vertical cavity surface emitting laser as defined in claim 12, wherein the cavities of the periodic cavity structure are drilled through the semi-insulating regions such that the active region includes a periodic structure of semi-insulating rings such that surface recombination of carriers is reduced in the active region.

14. A tunable vertical cavity surface emitting laser as defined in claim 8, wherein the depth of the cavities in the periodic cavity structure extends into the active region.

15. A tunable vertical cavity surface emitting laser as defined in claim 8, wherein the depth of the cavities in the periodic cavity structure extends through the active region and into the lower mirror layer.

16. A tunable vertical cavity surface emitting laser that emits a single mode, the vertical cavity surface emitting laser comprising:
   a substrate;
   a lower mirror layer formed on the substrate, wherein the lower mirror layer includes a plurality of distributed Bragg reflector layers;
   an active region formed on the lower mirror layer, wherein the active region includes a plurality of quantum wells;
   a plurality of semi-insulating regions formed in the active region;
   an upper mirror layer formed on the active region, wherein the upper mirror layer includes an upper photonic crystal that has a periodic cavity structure formed therein around a central defect, wherein the central defect does not include any cavities and wherein the periodic cavity structure corresponds to the plurality of semi-insulating regions, wherein each semi-insulating region is penetrated by a cavity to form a semi-insulating ring such that surface recombination of carriers in the active region is reduced, whereby the single mode is reflected by the photonic crystal, has appreciable gain in the active region, and is emitted through the central defect; and a tunable element formed on the upper mirror layer, wherein the tunable element includes a hologram, wherein a wavelength of the single mode can be changed by applying an electric field to the tunable element.

17. A tunable vertical cavity surface emitting laser as defined in claim 16, wherein the lower mirror layer further comprises a lower photonic crystal with a plurality of cavities formed therein without a central defect.

18. A tunable vertical cavity surface emitting laser as defined in claim 16, wherein each cavity of the periodic cavity structure formed in the upper photonic crystal has a depth that extends into the lower mirror layer through the semi-insulating regions.

19. A tunable vertical cavity surface emitting laser as defined in claim 16, wherein the single mode has a wavelength that is equal or greater than 1.3 microns.

20. A tunable vertical cavity surface emitting laser as defined in claim 16, further comprising an aperture through which laser light is emitted, wherein power of the single mode is increased by enlarging the aperture without emitting other modes because of a reflectivity of the photonic crystal.

21. A tunable vertical cavity surface emitting laser comprising:

a lower mirror layer formed on a substrate, wherein the lower mirror layer includes a plurality of distributed Bragg reflector layers;

an active region formed on the lower mirror layer, wherein the active region includes a plurality of quantum wells;

an upper mirror layer formed on the active region, wherein the upper mirror layer includes a photonic crystal with a central defect and a plurality of distributed Bragg reflector layers separate from the photonic crystal, wherein the central defect is surrounded by a plurality of cavities that are drilled in the photonic crystal;

a tunable element formed on the upper mirror layer, the tunable element comprising an electrostrictive material that includes a reflection hologram, wherein a wavelength of an emitted mode is changed by applying an electric field to the tunable element.

22. A tunable vertical cavity surface emitting laser comprising:

a lower mirror layer formed on a substrate, wherein the lower mirror layer includes a plurality of distributed Bragg reflector layers;

an active region formed on the lower mirror layer, wherein the active region includes a plurality of quantum wells;

an upper mirror layer formed on the active region, wherein the upper mirror layer includes an upper photonic crystal with a central defect, wherein the central defect is surrounded by a plurality of cavities that are drilled in the upper photonic crystal, wherein the central defect comprises a region without cavities or holes;

a tunable element formed on top of the upper photonic crystal of the upper mirror layer, the tunable element comprising an electrostrictive material having a reflection hologram with a narrow filter function embedded therein, wherein a wavelength of an emitted mode is changed by applying an electric field to the tunable element.

* * * * *